(12) United States Patent  
Heard

(10) Patent No.: US 6,680,847 B2
(45) Date of Patent: Jan. 20, 2004

(54) ELECTRONIC CIRCUITRY ENCLOSURE WITH AIR VENTS THAT COMPLY WITH EMISSIONS AND SAFETY STANDARDS

(75) Inventor: Christopher S. Heard, Brookline, NH (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/026,194

(22) Filed: Dec. 21, 2001

(65) Prior Publication Data

US 2002/0080580 A1 Jun. 27, 2002

Related U.S. Application Data

(60) Provisional application No. 60/258,000, filed on Dec. 22, 2000.

(51) Int. Cl.$^7$ ................................................. H05K 7/20
(52) U.S. Cl. .................. 361/692; 174/35 GC; 361/818; 454/184
(58) Field of Search ................................. 361/689, 690, 361/692, 693, 800, 816, 818; 174/35 R, 35 MS, 35 GC, 16.1; 454/184; 165/80.3, 121–126

(56) References Cited

U.S. PATENT DOCUMENTS

| 5,201,879 | A | | 4/1993 | Steele |
| 5,697,840 | A | | 12/1997 | Bainbridge et al. |
| 6,297,446 | B1 | * | 10/2001 | Cherniski et al. .......... 174/35 R |
| 6,426,459 | B1 | * | 7/2002 | Mitchell ................ 174/35 MS |
| 2001/0000392 | A1 | * | 4/2001 | Mitchell |
| 2002/0080580 | A1 | * | 6/2002 | Heard |

FOREIGN PATENT DOCUMENTS

| EP | 0 397 616 A1 | 11/1990 |
| FR | 2 741 504 A1 | 5/1997 |
| JP | 06224250 | 8/1996 |
| JP | 2000034586 | 9/2000 |
| WO | WO 00/64230 A1 | 10/2000 |

\* cited by examiner

Primary Examiner—Gerald Tolin
(74) Attorney, Agent, or Firm—Kudirka & Jobse, LLP

(57) ABSTRACT

An air vent comprises a vent assembly including an electrically-conductive screen mounted inside an enclosure constructed of panels. One or more of the panels has an array of holes through it. The holes are configured and sized to prevent an appendage, such as a finger from penetrating the enclosure. However, the collective hole area is sufficient to permit adequate airflow. The conductive screen covers the holes and provides for EMI suppression.

10 Claims, 3 Drawing Sheets

ELECTRONIC CIRCUITRY ENCLOSURE WITH AIR VENTS THAT COMPLY WITH EMISSIONS AND SAFETY STANDARDS

RELATED APPLICATIONS

This application is related to, and claims priority of, U.S. provisional application No. 60/258,000, entitled ELECTRONIC CIRCUITRY ENCLOSURE WITH AIR VENTS THAT COMPLY WITH EMISSIONS AND SAFETY STANDARDS filed on Dec. 22, 2000, by Christopher S. Heard.

FIELD OF THE INVENTION

This invention relates to electronic circuitry enclosures with ventilation holes that comply with standards regulating both EMI radiation and safety.

BACKGROUND OF THE INVENTION

Air vents are needed in enclosures used for electronic circuitry so that air can be pulled into and exhausted from them for the purpose of removing the heat generated by their internal electronic components. Electromagnetic interference (EMI) emission requirements and safety requirements, however, impose major limitations on how those air vents can be implemented. The switching frequency for state-of-the-art electronic circuitry can be 2.5 GHz or higher resulting in non-negligible harmonic frequencies as high as 12.5 GHz. Holes in enclosures exceeding 0.2 inches, therefore, become one-quarter wavelength antennas and make it virtually impossible to meet current EMI emission standards.

Safety requirements also impose restrictions on the way in which air vents can be implemented. The International Electrotechnical Commission standard (IEC-950) defines a "push test" designed to ensure that personnel cannot be injured by accidentally inserting appendages into the enclosure where they are exposed to a possible electric shock hazard.

It is difficult to construct an air vent with holes restricted to 0.2 inches or less that has both enough open space to allow sufficient air to pass through and enough strength to pass the IEC-950 push test. Metal sheets perforated with holes of this size tend to be either insufficiently open to air or insufficiently strong. For the same reason, screens made of fine mesh that can be relatively easily penetrated are also inadequate.

The present disclosure describes a design for a vent that simultaneously satisfies all three of these requirements: air flow, emissions containment and safety.

SUMMARY OF THE INVENTION

An air vent constructed in accordance with the principles of the invention comprises a vent assembly including an electrically-conductive screen mounted inside an enclosure constructed of panels. One or more of the panels has an array of holes through it. The holes are configured and sized to prevent an appendage, such as a finger from penetrating the enclosure. However, the collective hole area is sufficient to permit adequate airflow. The conductive screen covers the holes and provides for EMI suppression.

In one embodiment the holes have a hexagonal shape and are spaced closely together to provide adequate airflow.

In another embodiment, the conductive screen comprises one or two layers of a metal honeycomb mesh.

BRIEF DESCRIPTION OF THE DRAWINGS

The above and further advantages of the invention may be better understood by referring to the following description in conjunction with the accompanying drawings in which.

DETAILED DESCRIPTION

Figure 1:
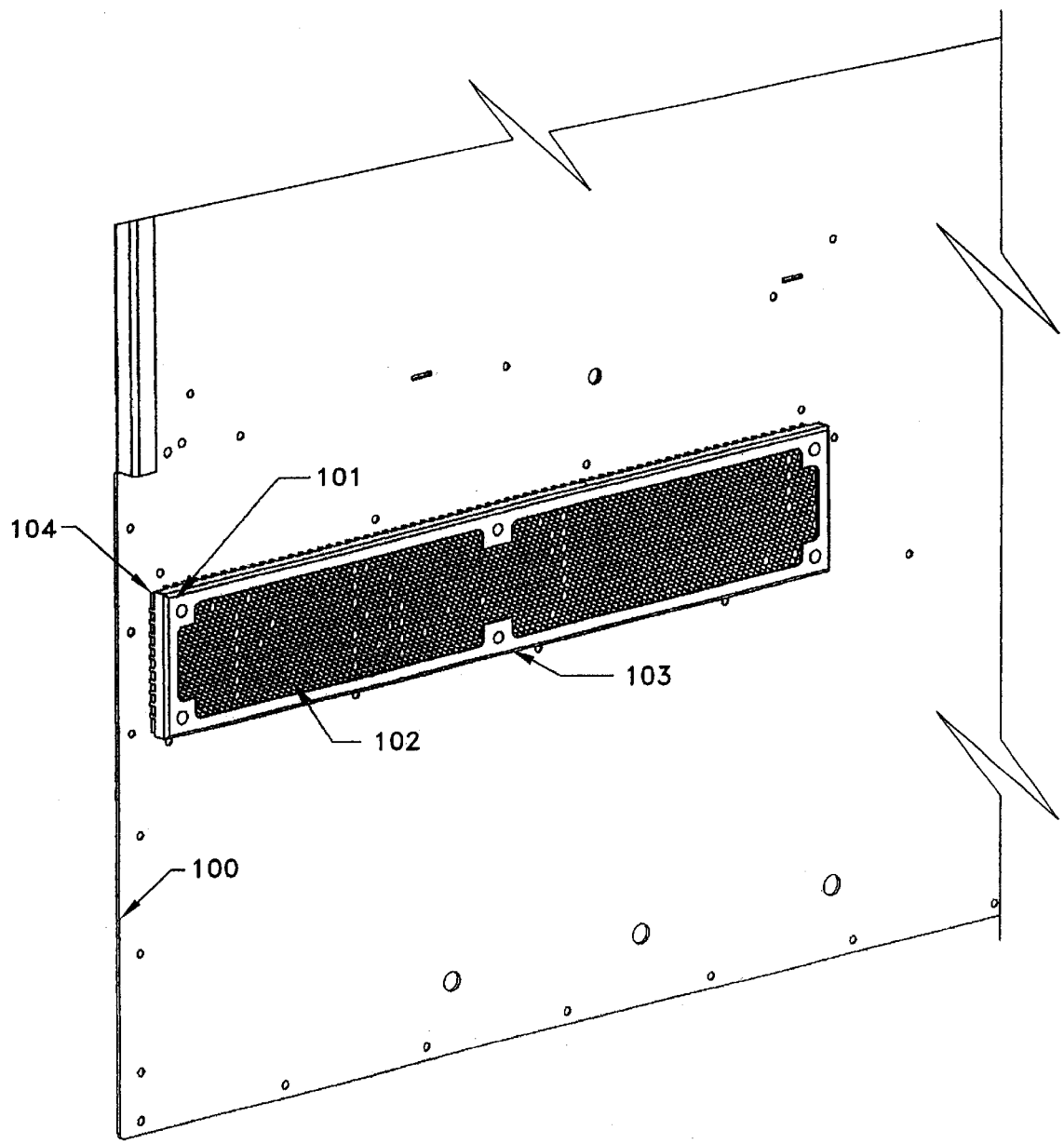
FIG. 1 is a portion of an enclosure panel illustrating the inside surface and an EMI shield.
Figure 3:
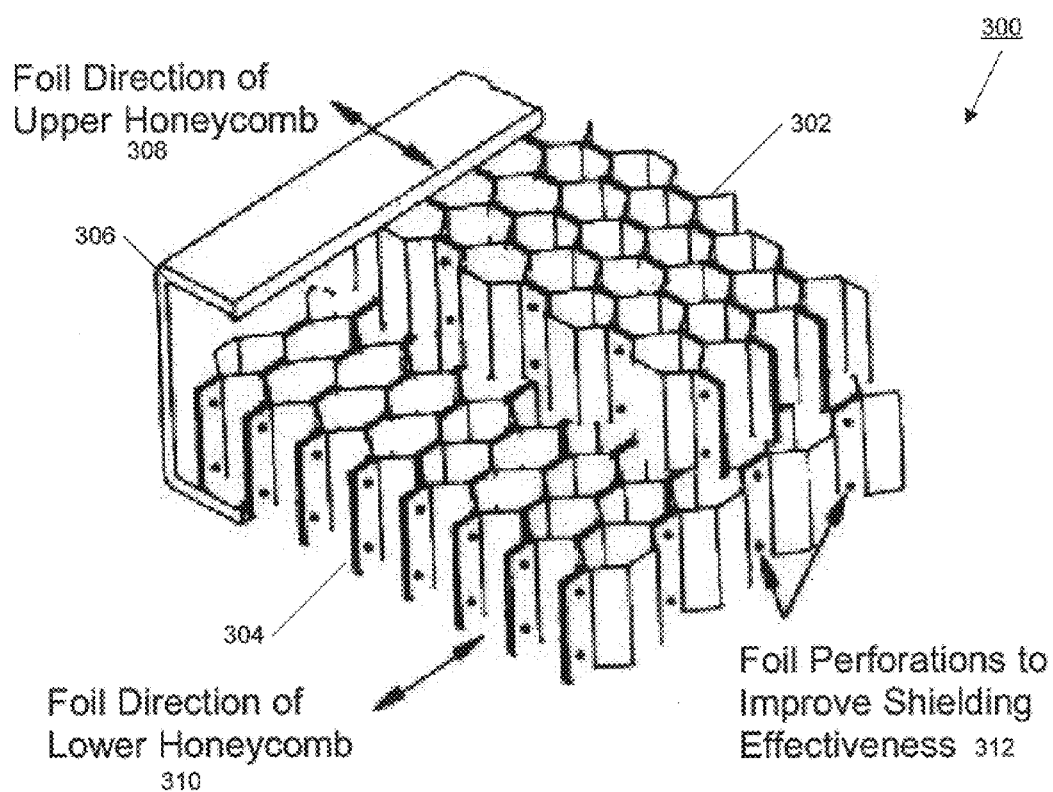
FIG. 3 is an expanded diagram of the air vent assembly showing the honeycomb mesh.

An enclosure panel that incorporates an air vent constructed in accordance with the principles of the invention is shown in FIG. 1. The air vent consists of a vent assembly (101) mounted on the inside of the enclosure panel (100) in combination with hexagonal holes in the panel itself. The vent assembly (101) is an air filter composed of at least one, and preferably two, layers of aluminum honeycomb (102) surrounded by a frame (103). The vent assembly 101 is shown in more detail in FIG. 3. The assembly 300 is composed of an upper honeycomb layer 302 and a lower honeycomb layer 304 wherein the foil directions, 308 and 310, are orthogonal to each other. The foil is also perforated as shown at 312 in order to improve shielding effectiveness.

The foil layers are enclosed in a peripheral frame 306. The frame 306 is fitted with a D-shaped electromagnetic-interference (EMI) gasket (104) made from a Monel knitted-wire mesh wrapped around sponge neoprene. A vent assembly suitable for use with the present invention is a OMNI-CELL ventilating panel, part number FPCV-12686, manufactured by Chomerics, Inc, 13 Little Pond Rd, Merrimac, Mass. 01860.

This vent assembly has 95% of the air flow capacity of an open hole of the same area and has excellent EMI containment properties. However, It is not sufficiently strong to pass the IEC-950 push test. Other mesh assemblies can be used, but in any case they should have at least 80% of the air flow capacity of an open hole of the same area.

Figure 2:
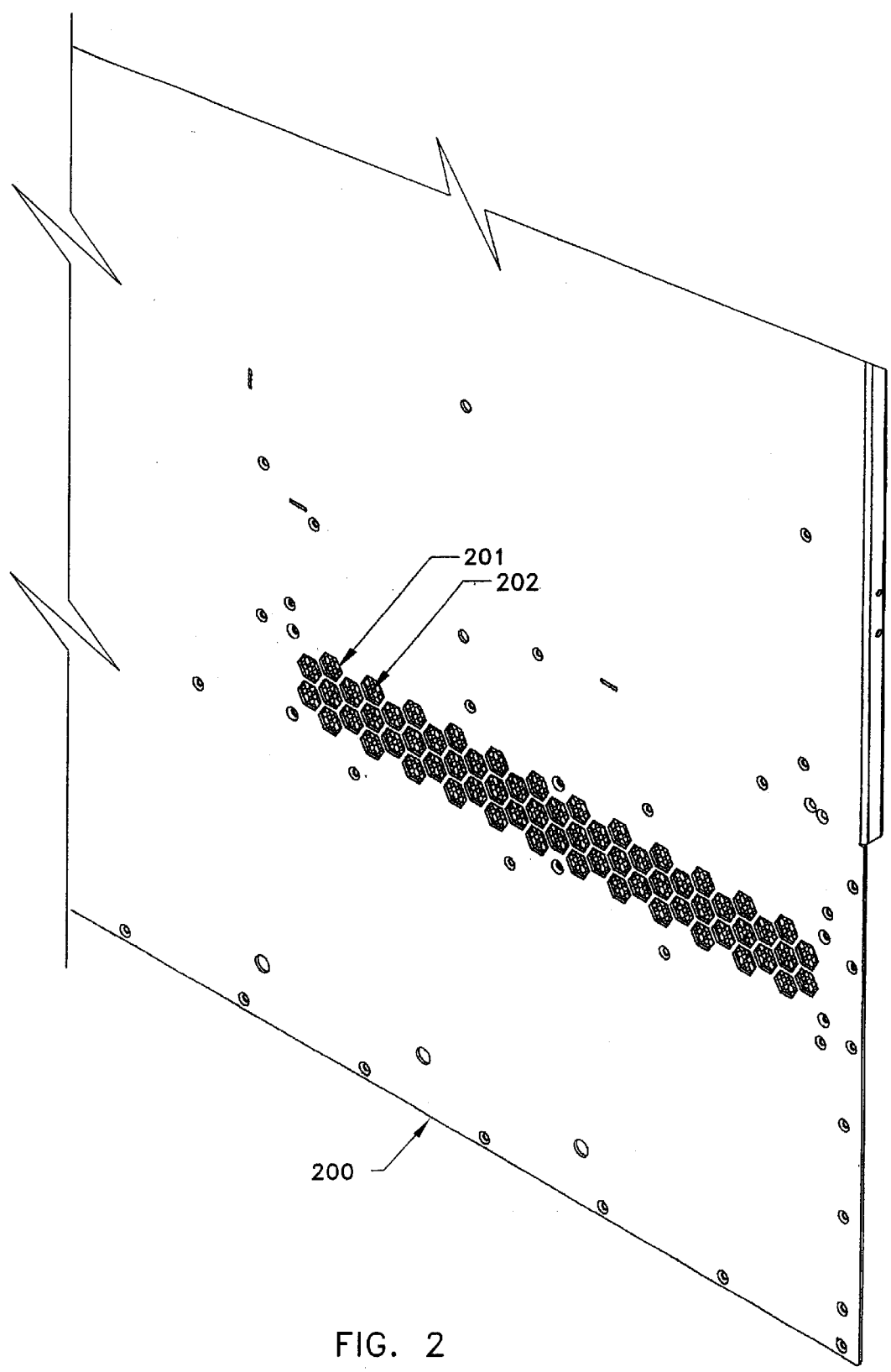
FIG. 2 is a portion of an enclosure panel illustrating the outside surface with an array of vent holes.

The solution to the strength requirement is illustrated in FIG. 2 showing the same enclosure panel (200) as seen from the outside of the enclosure. Hexagonal holes (201) are stamped out of the 0.060-inch-thick panel in front of the area in which the air filter (202) is mounted. The holes are 0.5 inches across, measured from flat edge to flat edge with 0.100 inches of metal separating adjacent sides of any two of those holes. The stamped out panel is still strong enough, and the holes small enough to prevent an appendage, such as a finger, as defined by the IEC-950 standard, from being inserted into the enclosure, but the resulting opening is large enough to reduce the airflow only marginally.

The combination of these two elements, the honeycomb air filter and the hexagonal holes in the panel, simultaneously meets all three objectives: it is open enough to allow sufficient air flow for cooling purposes, it contains EMI radiation up to 12.5 GHz and beyond and it is strong enough to pass the IEC-950 push test.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, although the description was directed to a particular hardware configuration, other hardware configurations could be used in the same manner as that described. Other aspects, such as conventional variations in the specific sizes of components recited in the specification to achieve a particular function, as well as other modifications to the inventive concept are intended to be covered by the appended claims.

What is claimed is:

1. A panel for an electronic circuitry enclosure, the panel being composed of a material having an inside surface facing the interior of the enclosure and air vents that comply with emissions and safety standards, comprising:

an array of vent holes in the panel, each vent hole having a size and shape that prevents an appendage from being inserted through the hole; and a vent assembly mounted on the panel over the array of holes and on the panel inside surface, the vent assembly having an area covered with an electrically-conductive screen having an air flow capacity at least 80 percent of an open hole of the same area and wherein the electrically-conductive screen comprises two layers of conductive honeycomb mesh having orthogonal foil directions.

2. The panel of claim 1 wherein each vent hole has a hexagonal shape with opposing flat edges.

3. The panel of claim 2 wherein each vent hole is 0.5 inches across from a flat edge to an opposing flat edge.

4. The panel of claim 1 wherein the array of vent holes is spaced apart with 0.100 inches of panel material separating adjacent flat edges of any two of the holes.

5. The panel of claim 1 wherein the electrically-conductive screen comprises at least one layer of a conductive honeycomb mesh.

6. The panel of claim 1 wherein the panel material is electrically conductive.

7. An air vent for an electronic circuitry enclosure having at least one substantially flat panel composed of a material having an inside surface facing the interior of the enclosure, the air vent comprising:

an array of vent holes in the panel, each vent hole having a hexagonal shape with a size that prevents an appendage from being inserted through the hole; and a vent assembly mounted on the panel over the array of holes and on the panel inside surface, the vent assembly having an area covered with an electrically-conductive screen having two layers of conductive honeycomb mesh having orthogonal foil directions.

8. The air vent of claim 7 wherein the hexagonal shape of each vent hole has opposing flat edges and wherein each vent hole is 0.5 inches across from a flat edge to an opposing flat edge.

9. The air vent of claim 7 wherein the array of vent holes is spaced apart with 0.100 inches of panel material separating adjacent flat edges of any two of the holes.

10. The air vent of claim 7 wherein the panel material is electrically conductive.

* * * * *